United States Patent
Hietala et al.

(10) Patent No.: US 6,229,991 B1
(45) Date of Patent: May 8, 2001

(54) METHOD OF AND APPARATUS FOR AUTOMATIC FREQUENCY CONTROL RANGE EXTENSION

(75) Inventors: Alexander W. Hietala, Phoenix, AZ (US); Arvind S. Arora, Chicago, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/170,768

(22) Filed: Oct. 13, 1998

(51) Int. Cl.[7] ................................................ H04B 17/00
(52) U.S. Cl. ............................ 455/75; 455/63; 455/136; 455/226.2; 455/76
(58) Field of Search ................................. 455/75, 76, 42, 455/43, 501, 63, 136, 141, 226.2

(56) References Cited

U.S. PATENT DOCUMENTS

| 5,319,327 | | 6/1994 | König ........................... 333/188 |
| 5,511,235 | | 4/1996 | Duong et al. ..................... 455/75 |
| 5,564,091 | * | 10/1996 | Goldinger ...................... 455/226.2 |
| 5,603,109 | * | 2/1997 | Feeney ......................... 455/192.2 |
| 5,875,388 | * | 2/1999 | Daughtry, Jr. et al. ............ 455/67.1 |
| 5,940,748 | * | 8/1999 | Daughtry, Jr. et al. ........... 455/182.2 |
| 5,974,098 | * | 10/1999 | Tsuda .............................. 375/340 |
| 6,028,900 | * | 2/2000 | Taura et al. ....................... 375/344 |

* cited by examiner

*Primary Examiner*—Thanh Cong Le
*Assistant Examiner*—Thuan T. Nguyen
(74) *Attorney, Agent, or Firm*—Mark D. Patrick; Hisashi D. Watanabe

(57) ABSTRACT

By employing AFC range extension, a high frequency communication device (100) can use a low cost, low accuracy crystal (119) in its reference oscillator (118). AFC range extension involves varying receive bandwidth of the communication device (100) to facilitate AFC or automatic frequency control. In particular, the receive bandwidth is set to a first, wide setting for AFC acquisition purposes (208). Frequency error associated with a received AFC signal is determined (212) and receive reception is adjusted (218) to reduce frequency error in the communication device (100). Once the frequency error is below a predetermined threshold (214), the receive bandwidth is set to a second setting different from the first setting for normal reception (220).

16 Claims, 3 Drawing Sheets

//METHOD OF AND APPARATUS FOR AUTOMATIC FREQUENCY CONTROL RANGE EXTENSION

FIELD OF THE INVENTION

The present invention relates generally to communication devices employing automatic frequency control (AFC) and more particularly to extending the range of AFC in those communication devices.

BACKGROUND OF THE INVENTION

In an effort to alleviate frequency spectrum crowding and expand services, high frequency bandwidth has been allocated for subscriber communication systems. One such high frequency subscriber communication system is the Digital Cellular System (DCS) 1800 radiotelephone system, which has a transmit frequency band of 1710 MHz–1785 MHz and a receive frequency band of 1805 MHz–1880 MHz. The DCS 1800 frequencies are roughly two times larger than that of conventional radiotelephone systems, such as the Global Standard for Mobile (GSM) system whose transmit frequency band is 890 MHz–915 MHz and receive frequency band is 935 MHz–960 MHz.

In order to communicate with the DCS 1800 radiotelephone system, a DCS 1800 radiotelephone performs AFC to synchronize a receiver of the radiotelephone to a base station transmitter of the system. AFC includes automatically correcting, to within an acceptable degree of error, frequency discrepancies between the carrier frequency of the signal to be received from the base station transmitter and the frequency of a crystal reference oscillator of the radiotelephone from which receiver reception is set. The DCS 1800 radiotelephone initiates AFC by receiving and processing a 67 kHz tone sent by a DCS 1800 base station transmitter on a control channel. However, if the initial frequency error of the DCS 1800 radiotelephone is too great, the tone can become too attenuated and fall outside of the bandwidth of the receiver. To prevent this from happening, the DCS 1800 radiotelephone uses a crystal reference oscillator having a crystal with a high accuracy of +/−16 ppm. Unfortunately, the +/−16 ppm crystal is expensive. For example, the +/−16 ppm crystal is about 20% greater in cost than the +/−25 ppm crystal traditionally employed in GSM radiotelephones. However, use of the +/−25 ppm crystal in place of the +/−16 ppm crystal in the DCS 1800 radiotelephone described above is not acceptable as such substitution would result in initial frequency errors of about +/−50 kHz, which are large enough to prevent correct reception by the radiotelephone.

Therefore, what is needed is a way to avoid use of expensive, high accuracy crystals in a high frequency communication device, such as a DCS 1800 radiotelephone, without sacrificing AFC.

DETAILED DESCRIPTION OF THE DRAWINGS

By employing AFC range extension, a high frequency communication device, such as a DCS 1800 radiotelephone, can use a low cost, low accuracy crystal in its reference oscillator. AFC range extension involves varying receive bandwidth of the radiotelephone to facilitate AFC. In particular, the receive bandwidth is set to a first, wide setting for AFC acquisition purposes. Frequency error associated with a received AFC signal is determined and receive reception is adjusted to reduce frequency error in the radiotelephone. Once the frequency error is below a predetermined threshold, the receive bandwidth is set to a second setting different from the first setting for normal reception.

Figure 1:
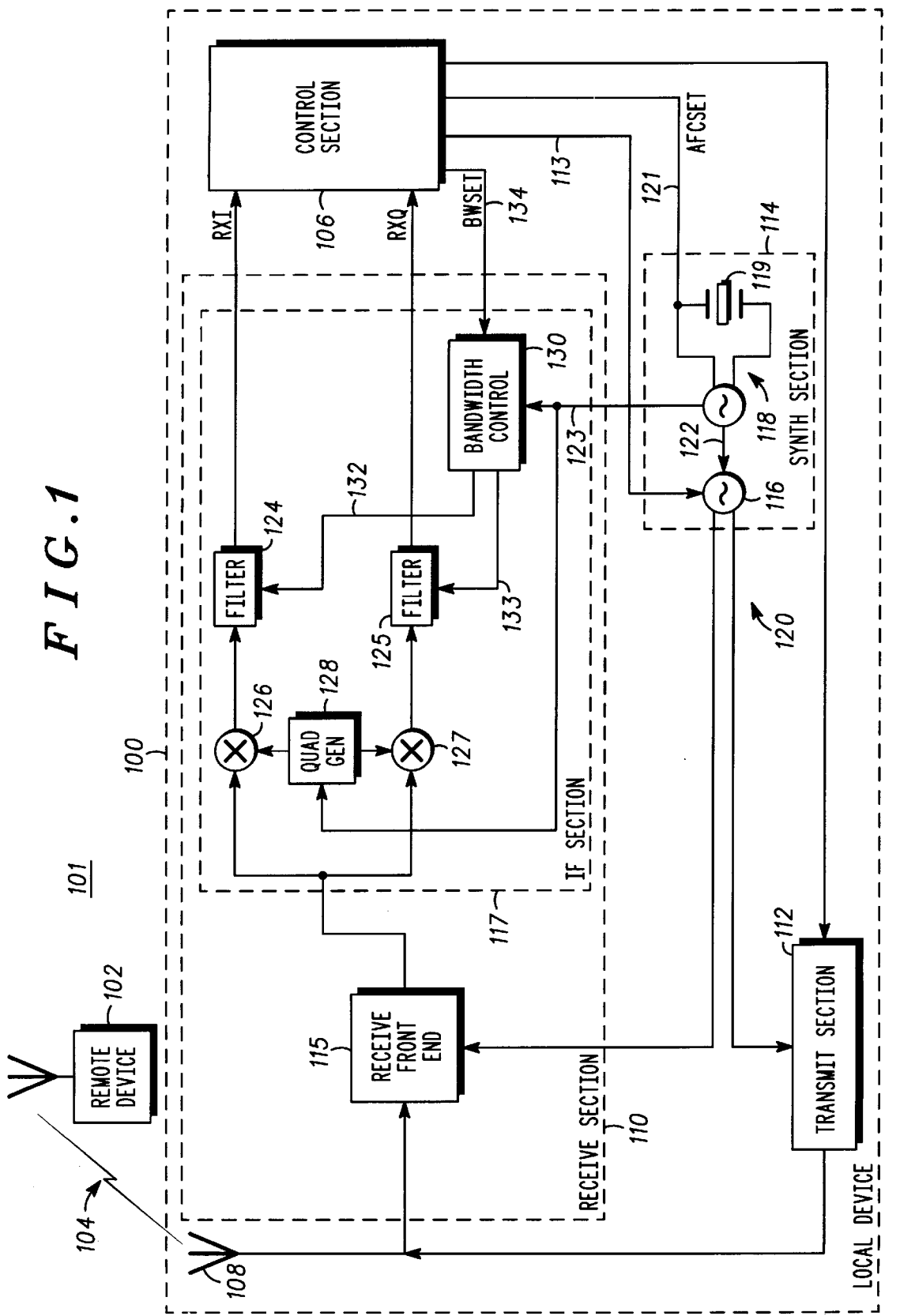
FIG. 1 is a block diagram showing a radiotelephone employing an apparatus for AFC range extension.

A local communication device 100, which is shown in FIG. 1 as a radiotelephone, is operable to communicate in a communication system 101 with a remote communication device 102 via a signaling link 104 of communication signals, such as RF signals. As a radiotelephone, the local device 100, which operates under control of a control section 106, uses an antenna 108 to couple RF signals to and from the signaling link 104, uses a receive section 110 to receive the RF signals at the antenna 108 and convert the received RF signals for processing by the control section 106, and uses a transmit section 112 to convert signals generated by the control section 106 for transmission as RF signals and provides the transmit RF signals to the antenna 108.

The control section 106 tunes a receive front end 115 of the receive section 110 and the transmit section 112 for channelized reception and transmission, respectively, using a voltage controlled oscillator (VCO) 116 of a synthesizer section 114 of the local device 100. The control section 106 controls the VCO 116 via connection 113. The receive section 110 employs an intermediate frequency (IF) section 117 for quadrature demodulation of the received signal via mixing and low pass filtering. The VCO 116 and the IF section 117 operate based on a reference signal output by a reference oscillator 118 of the synthesizer section 114. To minimize cost, the reference oscillator 118 employs a low accuracy or "sloppy" crystal 119, such as that with an accuracy of less than +/−16 ppm, such as +/−25 ppm.

The local device 100 is a radiotelephone capable of operating at frequencies above 1000 MHz, such as a DCS 1800 radiotelephone that receives RF signals at frequencies between 1710 MHz and 1785 MHz, a Personal Communication Services (PCS) 1900 radiotelephone that receives RF signals at frequencies between 1805 MHz and 1880 MHz, a satellite radiotelephone that receives RF signals at frequencies around 1600 MHz, or the like. As a DCS 1800 radiotelephone, for example, the local device 100 must receive and process a Frequency Correction Burst (FCB), which is a 67 kHz tone, transmitted by the remote device 102 (which in this case is a DCS 1800 base station transmitter) on a Broadcast Control Channel (BCCH) for purposes of AFC and synchronization of, and communication between, the local and remote devices 100 and 102. Unfortunately, the use of the low accuracy crystal 119 makes the local device 100 initially susceptible to large amounts of frequency error that can cause the FCB to fall outside of the receive bandwidth of the local device 102 and prevent reception of the FCB; thereby, making AFC impossible.

To ensure reception of the FCB and proper execution of AFC, the local device 100 employs an apparatus for AFC range extension 120. The apparatus for AFC range extension 120 is defined by all or part of the control, receive, and synthesizer sections 106, 110, and 114. The apparatus for AFC range extension 120 includes the reference oscillator 118 of the synthesizer section 114. The reference oscillator 118, which employs the low accuracy crystal 119, is coupled to the control section 106 by connection 121, coupled to the VCO 116 by connection 122 and coupled to the IF Section 117 by connection 123. The reference oscillator 118 is a variable frequency oscillator. The reference oscillator 118, responsive to a frequency setting signal AFCSET output by the control section 106 on connection 121, generates the reference signal at a frequency defined by the signal AFCSET. The reference oscillator 118 is operable responsive to the control section 106 and the signal AFCSET to warp the crystal 119 from its running frequency. In a DCS 1800 radiotelephone, the reference oscillator 118 is a 26 MHz reference oscillator and is adjustable in the aforementioned manner by about 1.1 kHz.

The apparatus for AFC range extension 120 includes programmable filters 124 and 125 of the IF section 117 of the receive section 110. The filters 124 and 125 are low pass filters with a programmable bandwidth. In a DCS 1800 radiotelephone employing the crystal 119, initial frequency error can be as much as +/−50 kHz. As such, the filters 124 and 125 must be programmable to at least 120 kHz so as to pass the 67 kHz tone at any frequency between 17 kHz and 117 kHz. In operation, the filters 124 and 125 convert in-phase and quadrature-phase signals supplied by mixers 126 and 127 of the IF section 117 into baseband signals RXI and RXQ for processing by the control section 106. The mixers 126 and 127 generate the in-phase and quadrature-phase signals by mixing the receive signals channelized by the receive front end 115 with oscillator signals supplied by a quadrature generator 128 of the IF section 117. The quadrature generator 128 operates according to a reference signal derived from the reference signal supplied by the reference oscillator 118 on connection 123.

The apparatus for AFC range extension 120 includes a bandwidth control circuit 130 of the IF section 117 of the receive section 110. The bandwidth control circuit 130 is coupled to the filters 124 and 125 via respective connections 132 and 133, to the control section 106 via connection 134, and to the reference oscillator 118 via connection 123. The bandwidth control circuit 130 sets the bandwidth of the filters 124 and 125 according to both a bandwidth setting signal BWSET output by the control section 106 on connection 134 and a reference signal derived from the reference signal output by the reference oscillator 118 on connection 123.

Figure 2:
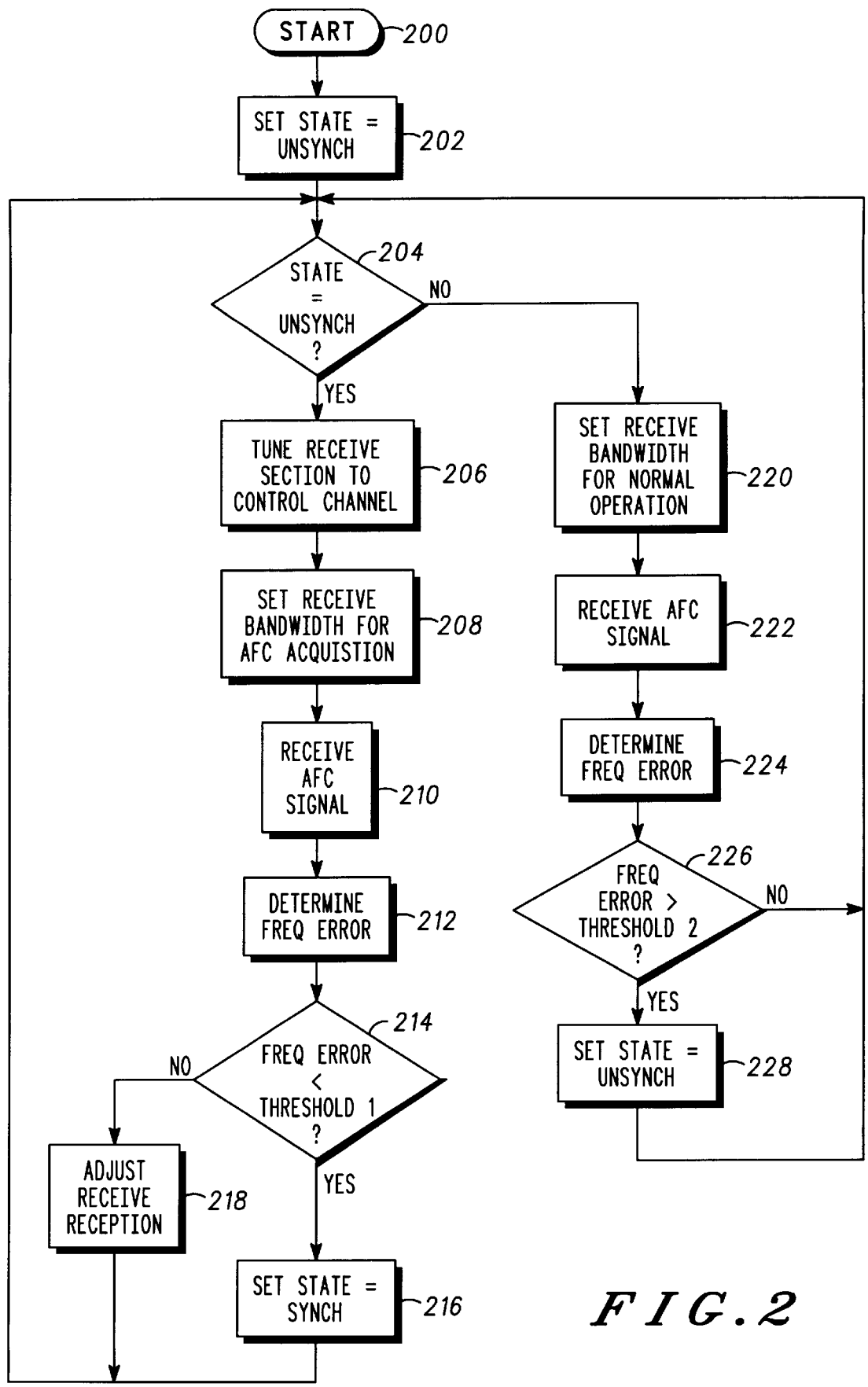
FIG. 2 is a flow chart showing a method for AFC range extension employed by the apparatus of FIG. 1.

The apparatus for AFC range extension 120 also includes the control section 106. The control section 106 executes the method illustrated in FIG. 2 to facilitate AFC in the local device 100. The control section 106 generally includes a microprocessor and memory within which control information and software instruction steps defining the method of FIG. 2 are stored. When the local device 100 is a DCS 1800 radiotelephone, the control section 106 specifically includes a call processor, a memory, a digital signal processor (DSP) and a modulator-demodulator (modem).

Initially (at step 200), the local device 100 does not communicate in synchronization with the remote device 102. The control section 106 sets the state of operation of the local device 100 to unsynchronized (at step 202).

When the state of operation of the local device 100 is unsynchronized (at step 204), the control section 106 attempts to gain synchronization by, first, tuning the receive front end 115 of the receive section 110 to a control channel, which in the DCS 1800 system is the BCCH (at step 206). initial frequency error due to the low accuracy crystal 119 does not hinder control channel tuning because of the wide spacing of the control channels in the communication system 101.

Figure 3:
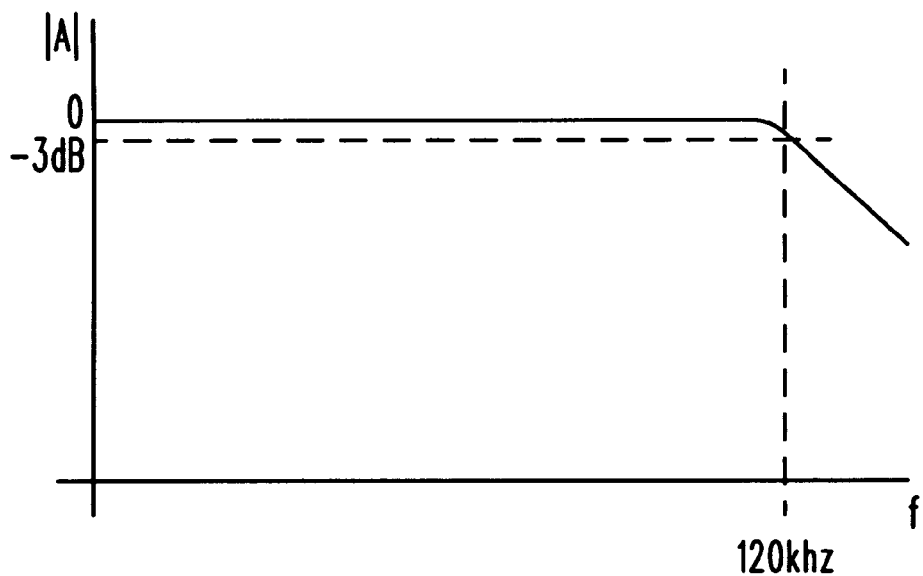
FIG. 3 is a graph showing the receive bandwidth of the apparatus of FIG. 1 in an AFC acquisition mode according to the method of FIG. 2.

Next, the control section 106 sets the receiver bandwidth for AFC acquisition, that is, for reception of the signal used for AFC (hereinafter "the AFC signal") (at step 208). The control section 106 controls the bandwidth control circuit 130 via connection 134 and signal BWSET to set the bandwidth of the filters 124 and 125 of the IF section 117 to a wide setting, such as that illustrated in FIG. 3. In the wide setting, the bandwidth of the filters 124 and 125 must be large enough to pass the AFC signal even when the local device 100 is in maximum frequency error, as designated by the accuracy of the crystal 119. In the DCS 1800 radiotelephone, the AFC signal is the 67 kHz tone and the filters 124 and 125 are set to have a 3 dB bandwidth of 120 kHz to ensure reception of the 67 kHz tone, which is subject to initial frequency error of +/−50 kHz because of the low accuracy crystal 119. One skilled in the art will recognize that a 3 dB bandwidth of 120 kHz permits reception of signals several kHz beyond 120 kHz, albeit with some attenuation.

Once the receiver bandwidth is set for AFC acquisition, the AFC signal is received by the control section 106 (at step 210). The control section 106 determines the frequency error of the local device 100 from the AFC signal (at step 212). The control section 106 measures the frequency at which the AFC signal is actually received and compares the measured frequency to the known frequency of the AFC signal. A difference in the measured and known frequencies define the frequency error of the local device 100. For example, in a DCS 1800 radiotelephone, if the 67 kHz tone is received at 107 kHz, the control section determines that the local device 100 is +40 kHz in frequency error.

The control section 106 compares the frequency error to a first error threshold (at step 214). If the frequency error is below the first error threshold, the frequency error is at an acceptable level and the control section 106 sets the state of operation of the local device 100 to synchronized (at step 216) and returns to evaluate the state of operation (at step 204). If the frequency error is equal to or above the first error threshold, the frequency error is at an unacceptable level and the control section 106 adjusts receiver reception to reduce the frequency error (at step 218). The control section 106 adjusts the reference oscillator 118 a predetermined amount via connection 121 and the signal AFCSET, which in turn changes the reference signal output by the reference oscillator 118 on connection 123. Taking the above example further, in the event that the local device 100 is experiencing +40 kHz in frequency error at a center frequency of 1850 MHz, the reference oscillator 118 would be operating at 26.0005622 MHz ((1850 MHz+40 kHz)/1850 MHz) * 26 MHz ). The control section 106 adjusts the reference oscillator 118 to exactly 26 MHz by tuning a varactor diode of the reference oscillator 118 using the signal AFCSET. This adjustment will move the VCO 116 driving the receive front end 115 and the reference signal driving the quadrature generator 128 by a ratio of 26/26.0005622 to decrease the frequency of the receive path by 40 kHz. Following receiver reception adjustment, the control section 106 returns to evaluate the state of operation (at step 204) and again execute steps 206, 208, 210, 212, 214 and 218 until the frequency error falls below the first error threshold and the state of operation of the local device 100 is set to synchronized (at step 216).

The first error threshold is set at a frequency error level below which the local device 100 can successfully maintain communication with the remote device 102 and continue to receive the AFC signal. The first error threshold is preferably set to about +/−5 kHz for the DCS 1800 radiotelephone.

Figure 4:
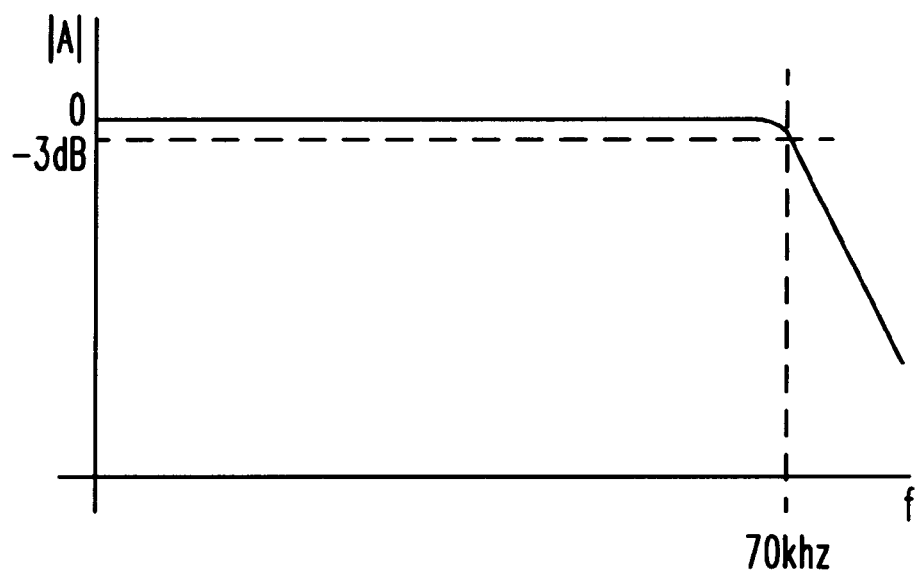
FIG. 4 is a graph showing the receive bandwidth of the apparatus of FIG. 1 in a normal mode according to the method of FIG. 2.

If the state of operation of the local device 100 is determined to be synchronized (at step 204), the control section 106 sets the receive bandwidth for normal operation (at step 220) to facilitate telephonic communication between the local device 100 and the remote device 102. This receive bandwidth setting is used to receive all signals other than the AFC signal at AFC acquisition. The control section 106 controls the bandwidth control circuit 130 via connection 134 and signal BWSET to set the bandwidth of the filters 124 and 125 of the IF section 117 to a narrow setting, such as that illustrated in FIG. 4. In the narrow setting, the bandwidth of the filters 124 and 125 should be constrained enough to pass signals present on the channel currently tuned to and avoid passing noise present on adjacent channels. In the DCS 1800 radiotelephone, the filters 124 and 125 are preferably set to have a 3 dB bandwidth of about 70 kHz. One skilled in the art will recognize that a 3 dB bandwidth of 70 kHz permits reception of signals several kHz beyond 70 kHz, albeit with some attenuation. In this setting, the filters 124 and 125 have an effective bandwidth of about 77 kHz.

During normal operation, the remote device 102 continues to send the AFC signal, which is received at the control section 106 of the local device 100 via the receive section 110 (at step 222). Initially during normal operation, the AFC signal is accurately received because the frequency error of the local device 102 is below the first error threshold. For example, in the DCS 1800 radiotelephone, by setting the 3 dB bandwidth of the filters 124 and 125 to about 70 kHz and accounting for their effective bandwidth, the 67 kHz tone will be received between 62 kHz and 72 kHz when the local device 102 is in +/−5 kHz of frequency error as defined by the first error threshold. The control section 106 determines the frequency error of the local device 100 from the AFC signal in the manner previously described in step 212 (at step 224). The control section 106 compares the frequency error to a second error threshold (at step 226). If the frequency error is below the second error threshold, the frequency error is at an acceptable level and the control section 106 returns to evaluate the state of operation (at step 204). If the frequency error is equal to or above the second error threshold, the frequency error is at an unacceptable level and the control section 106 sets the state of operation of the local device 100 to unsynchronized (at step 228) and returns to evaluate the state of operation (at step 204).

The second error threshold is set at a frequency error level that is greater than that defined by the first error threshold. This allows for stable operation of the local device 100 with hysteresis. The second error threshold is preferably set according to the effective bandwidth of the narrow setting of the filters 124 and 125. In the DCS 1800 radiotelephone, the second error threshold is about +/−10 kHz. Even though attenuated, the AFC signal can continue to be received when the local device 100 is in frequency error by +10 kHz; however, reception of the AFC signal indicating this much frequency error is a good indication that synchronization with the remote device 102 is lost.

Thus, it can be seen that AFC range extension involving increasing the receive bandwidth for AFC acquisition enables use of a low cost, low accuracy crystal in a high frequency communication device, thereby, providing for a lower cost device. While particular embodiments of the present invention have been shown, described, and preferred, modifications may be made. For example, the AFC extension apparatus may be employed in a multi-band communication device such as the GSM/DCS 1800 Dual Band Cellular Telephone manufactured and sold by Motorola, Inc. As a GSM/DCS 1800 dual band radiotelephone, the receive front end 115 of the local device 100 would employ dual receive paths suitable for reception at about 900 MHz (i.e., GSM) and at about 1800 MHz (i.e., DCS 1800), which receive paths converge prior to the IF section 117. For better performance, the IF section 117 may employ a second stage of low pass programmable filters and two stages of amplifiers interposed between both the two filter stages and the control section 106. Each second stage filter would be connected to and programmed by the bandwidth control circuit 130 in the manner previously described with respect to filters 124 and 125. Although shown to be specifically incorporated into a cellular telephone, it will be recognized that AFC range extension may also be beneficially used in other portable devices including, but not limited to, two-way radios, radiotelephones, pagers, landline telephones, cordless telephones and the like. It is therefore intended in the appended claims to cover all such changes and modifications which fall within the true spirit and scope of the invention.

What is claimed is:

1. A method of automatic frequency control (AFC) range extension, the method comprising the steps of:

setting receive bandwidth to a wide setting to receive a first signal the wide setting suitable to pass an AFC signal in maximum frequency error;

determining frequency error from the first signal;

adjusting receive reception to reduce the frequency error when the frequency error is equal to or above a first threshold; and setting receive bandwidth to a narrow setting different from the wide setting when the frequency error is below the first threshold, the narrow setting suitable to pass signals other than the AFC signal without substantial adjacent channel noise.

2. The method according to claim 1, further comprising the steps of:

determining frequency error when the receive bandwidth is set to the narrow setting; and returning to the step of setting receive bandwidth to a wide setting when the frequency error measured, when the receive bandwidth is set to the narrow setting exceeds a second threshold, the second threshold being different from the first threshold.

3. The method according to claim 1, further comprising the steps of:

generating a reference signal, the reference signal initially being in error by an amount less than or equal to a predetermined maximum amount, and tuning to a control channel; and wherein the step of setting receive bandwidth to a wide setting includes the step of setting receive bandwidth to the wide setting based on the reference signal.

4. The method according to claim 3, wherein:

the step of generating a reference signal includes the step of generating a reference signal initially in error by an amount between 0 kHz and +/−50 kHz; and the step of setting receive bandwidth to a wide setting includes the step of setting receive bandwidth to about 120 kHz to receive a 67 kHz tone.

5. The method according to claim 1, wherein the step of setting receive bandwidth to a narrow setting includes the step of setting receive bandwidth to about 70 kHz.

6. An apparatus for AFC range extension, the apparatus comprising:
- a receive section to receive communication signals, the receive section including a plurality of programmable filters;
- a control section coupled to the receive section, the control section to set the receive section to have a first bandwidth prior to receiving a first one of the communication signals and to set the receive section to have a second bandwidth different from the first bandwidth setting when frequency error in the first one of the communication signals is below a first threshold and
- a reference oscillator coupled to the receive section and the control section,
- wherein the plurality of programmable filters are capable of passing the first one of the communication signals when the reference oscillator is in maximum frequency error, the first one of the communication signals being a signal used for AFC, and the plurality of programmable filters are capable of passing a second one of the communication signals without substantial adjacent channel noise when the reference oscillator has frequency error below a second threshold.

7. The apparatus according to claim 6, wherein the reference oscillator includes a crystal having low accuracy, the reference oscillator being effective to generate a reference signal having a frequency based on the crystal.

8. The apparatus according to claim 7 wherein the crystal has an accuracy less than +/−16 ppm.

9. The apparatus according to claim 8 wherein the crystal has an accuracy of about +/−25 ppm.

10. The apparatus according to claim 7 wherein the reference oscillator, responsive to a first setting signal from the control section, adjusts the frequency of the reference signal.

11. The apparatus according to claim 7 wherein the receive section includes a bandwidth control circuit, the bandwidth control circuit coupled to the control section, the reference oscillator and the plurality of programmable filters, the bandwidth control circuit, responsive to a second setting signal from the control section and the reference signal, to set a bandwidth of the plurality of programmable filters.

12. The apparatus according to claim 6 wherein the plurality of programmable filters are settable to a 120 kHz bandwidth, and the signal used for AFC is a 67 kHz tone.

13. A radiotelephone comprising:
- an antenna;
- a transmit section coupled to the antenna;
- a synthesizer section coupled to the transmit section, the synthesizer section including a reference oscillator, the reference oscillator including a crystal with low accuracy, the reference oscillator to generate a reference signal having a frequency based on the crystal, the reference oscillator to adjust the frequency of the reference signal according to a AFC setting signal;
- a receive section coupled to the antenna and the synthesizer section, the receive section including a receive front end to receive communication signals from the antenna and an intermediate frequency (IF) section to demodulate the received communication signals, the IF section including a plurality of low pass filters with a programmable bandwidth and a bandwidth control circuit coupled to each of the plurality of low pass filters and the reference oscillator, the bandwidth control circuit to set the programmable bandwidth of the plurality of low pass filters according to the reference signal and a bandwidth setting signal; and
- a control section coupled to the transmit section, the reference oscillator of the synthesizer section and the bandwidth control circuit of the IF section, the control section to generate the bandwidth setting signal so as to set the programmable bandwidth of the plurality of low pass filters to a wide setting to facilitate reception of one of the communication signals used for AFC, and the control section to generate the bandwidth setting signal so as to set the programmable bandwidth of the plurality of low pass filters to a narrow setting so as to facilitate reception of the other ones of the communication signals without substantial adjacent channel noise once frequency error of the one of the communication signals used for AFC is below a threshold.

14. The radiotelephone according to claim 13 wherein the crystal has an accuracy less than +/−16 ppm.

15. The radiotelephone according to claim 13 wherein the radiotelephone is a dual band radiotelephone operable for reception of the communications signals transmitted in a first band of frequencies and in a second band of frequencies, the second band of frequencies about two times larger than the first band of frequencies.

16. The radiotelephone according to claim 13, wherein:
- the programmable bandwidth of the plurality of low pass filters is about 120 kHz in the wide setting;
- the one of the communication signals used for AFC is a 67 kHz tones and the programmable bandwidth of the plurality of low pass filters is about 70 kHz in the narrow setting.

* * * * *